(12) United States Patent
Taguchi et al.

(10) Patent No.: US 11,398,592 B2
(45) Date of Patent: Jul. 26, 2022

(54) METHOD FOR MANUFACTURING LIGHT EMITTING MODULE AND LIGHT EMITTING MODULE

(71) Applicant: NICHIA CORPORATION, Anan (JP)

(72) Inventors: Koji Taguchi, Anan (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 119 days.

(21) Appl. No.: 17/031,879

(22) Filed: Sep. 24, 2020

(65) Prior Publication Data
US 2021/0091285 A1 Mar. 25, 2021

(30) Foreign Application Priority Data

Sep. 25, 2019 (JP) .............................. JP2019-174798
Aug. 26, 2020 (JP) .............................. JP2020-142552

(51) Int. Cl.
| | |
|---|---|
| *H01L 33/62* | (2010.01) |
| *H01L 25/075* | (2006.01) |
| *H01L 33/60* | (2010.01) |
| *F21V 8/00* | (2006.01) |

(52) U.S. Cl.
CPC ............ *H01L 33/62* (2013.01); *G02B 6/0021* (2013.01); *G02B 6/0055* (2013.01); *G02B 6/0065* (2013.01); *G02B 6/0068* (2013.01); *G02B 6/0073* (2013.01); *H01L 25/0753* (2013.01); *H01L 33/60* (2013.01); *H01L 2933/0058* (2013.01); *H01L 2933/0066* (2013.01)

(58) Field of Classification Search
CPC .... G06F 1/1684; G02B 6/0013; G02B 6/0065
See application file for complete search history.

(56) References Cited

U.S. PATENT DOCUMENTS

| | | | |
|---|---|---|---|
| 9,543,484 B1 | 1/2017 | Endo et al. | |
| 2013/0099666 A1 | 4/2013 | Stuffle | |

(Continued)

FOREIGN PATENT DOCUMENTS

| | | | |
|---|---|---|---|
| JP | 2011129646 A | 6/2011 | |
| JP | 2012124443 A | 6/2012 | |

(Continued)

*Primary Examiner* — Mary Ellen Bowman
(74) *Attorney, Agent, or Firm* — Hunton Andrews Kurth LLP

(57) ABSTRACT

A method for manufacturing a light emitting module includes: providing light emitting devices each including a light emitting element having an upper surface, a lateral surface, and an electrode positioned on the upper surface, a first light reflective member arranged on the lateral surface of the light emitting element, and a metal film formed on upper surfaces of the electrode and the first light reflective member; placing the light emitting devices on a light guide plate with gaps between the light emitting devices, with the metal films of the light emitting devices facing upward; forming masks respectively covering the metal films; forming a second light reflective member in the gaps between the light emitting devices on the light guide plate; removing the masks; and forming, on the light emitting devices and on the second light reflective member, wiring segments that connect to the metal films.

14 Claims, 13 Drawing Sheets

(56) References Cited

U.S. PATENT DOCUMENTS

| | | | |
|---|---|---|---|
| 2013/0240930 A1* | 9/2013 | Akimoto | H01L 33/62 438/26 |
| 2017/0179344 A1* | 6/2017 | Matsuda | H01L 33/0095 |
| 2018/0239193 A1 | 8/2018 | Hayashi | |
| 2019/0296201 A1 | 9/2019 | Knoerr | |

FOREIGN PATENT DOCUMENTS

| | | | | | |
|---|---|---|---|---|---|
| JP | 2012138454 A | | 7/2012 | | |
| JP | 2012227470 A | | 11/2012 | | |
| JP | 2013197310 A | | 9/2013 | | |
| JP | 2016054267 A | | 4/2016 | | |
| JP | 2016115729 A | | 6/2016 | | |
| JP | 2017055037 A | | 3/2017 | | |
| JP | 2017118098 A | | 6/2017 | | |
| JP | 2018133304 A | * | 8/2018 | | F21V 9/08 |
| JP | 2018133304 A | | 8/2018 | | |
| JP | 2019518331 A | | 6/2019 | | |

* cited by examiner

METHOD FOR MANUFACTURING LIGHT EMITTING MODULE AND LIGHT EMITTING MODULE

CROSS-REFERENCE TO RELATED APPLICATIONS

The present application claims priority under 35 U.S.C. § 119 to Japanese Patent Application No. 2020-142552, filed Aug. 26, 2020, which claims priority to Japanese Patent Application No. 2019-174798, filed Sep. 25, 2019, the disclosures of which are herein incorporated by reference in their entireties.

BACKGROUND

The present disclosure relates to a method for manufacturing a light emitting module and to a light emitting module.

Conventionally, there is known a light emitting module which can be used, for example, as a backlight of a liquid crystal display (see Japanese Patent Application Laid Open No. 2018-133304). This light emitting module is configured such that white resin is filled between light emitting elements arranged on a light guide plate and wiring connected to electrodes of the light emitting elements is formed of metal films, thereby to be reduced in thickness. Further, in order to alleviate difficulties in the high packaging density due to miniaturization of semiconductor elements, there have been developed chip on board (COB) light emitting devices whose size in a plan view is made one size larger than their chips by resin. For example, Japanese Patent Application Laid Open No. 2017-118098 discloses a thin-type light emitting device that includes a light emitting element and metal films extending from electrodes of the light emitting element to lateral sides of the light emitting device in a plan view. The metal films serve as the terminals for mounting the light emitting device.

SUMMARY

An object of the embodiments of the present disclosure is to provide a method for manufacturing a light emitting module with high connection reliability and to provide a light emitting module with high connection reliability.

A method for manufacturing a light emitting module according to an embodiment of the present disclosure includes: providing light emitting devices each including a light emitting element having an upper surface, a lateral surface, and an electrode positioned on the upper surface of the light emitting element and having an upper surface, a first light reflective member arranged on the lateral surface of the light emitting element and having an upper surface, and a metal film formed on the upper surface of the electrode and the upper surface of the first light reflective member; placing the light emitting devices on a light guide plate with gaps between the light emitting device, with the metal films of the light emitting devices facing upward; forming masks respectively covering the metal films; forming a second light reflective member in the gaps between the light emitting devices on the light guide plate; removing the masks; and forming, on the light emitting devices and on the second light reflective member, wiring segments that connect to the metal films.

A light emitting module according to an embodiment of the present disclosure includes: a light guide plate; a plurality of light emitting elements disposed on the light guide plate with gaps between the plurality of light emitting elements and each including an upper surface, a lateral surface, an electrode disposed on the upper surface and having an upper surface, and a first light reflective member disposed on the lateral surface of the light emitting element and having an upper surface; a second light reflective member having an upper surface and formed in the gaps between the plurality of light emitting elements such that the upper surfaces of the electrodes of the plurality of light emitting elements are exposed; metal films each having an upper surface and formed on the upper surface of the electrode and the upper surface of the first light reflective member of a corresponding one of the plurality of light emitting elements, and each connected to the upper surface of the electrode of the corresponding one of the plurality of light emitting elements; and wiring segments respectively formed on the upper surfaces of the metal films and on the upper surface of the second light reflective member such that the wiring segments respectively connect to the metal films at least in part. Each of the metal films extends from the connected electrode to the upper surface of the first light reflective member of the corresponding one of the plurality of light emitting elements in a plan view.

According to the embodiments described in the present disclosure, it is possible to provide a method for manufacturing a light emitting module with high connection reliability and to provide such a light emitting module.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF THE EMBODIMENTS

Figure 1A:
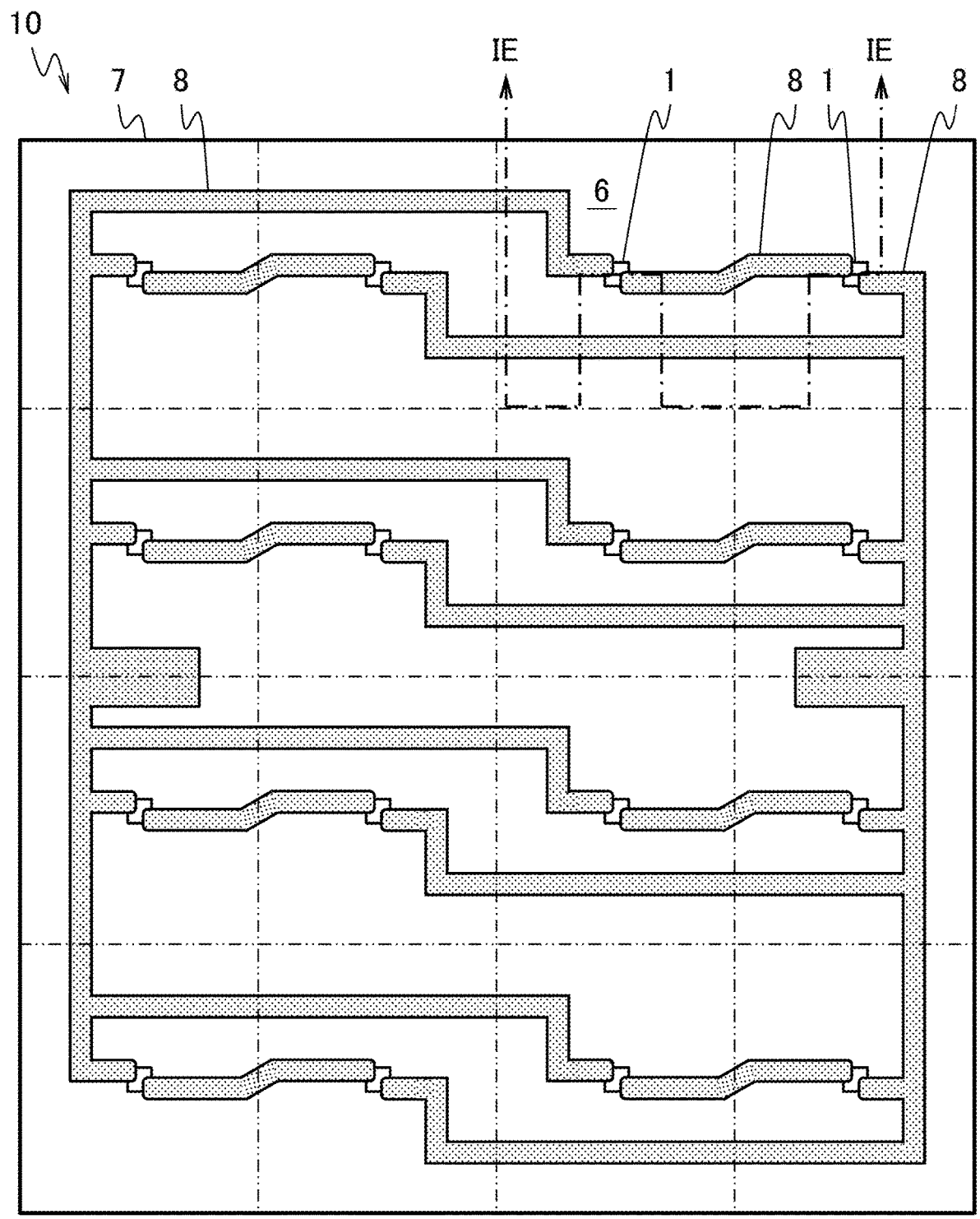
FIG. 1A is a plan view schematically illustrating the external appearance of the light emitting module according to an embodiment of the present disclosure.

Hereinafter, a description will be given of a light emitting module and a method for manufacturing a light emitting module with reference to the drawings. The drawings referenced in the description given below schematically illustrate embodiments of the present disclosure and the sizes and positional relationship of the members illustrated in the drawings may have been exaggerated and the shapes of the members may have been illustrated in a simplified manner. In the descriptions below, the same name or same reference sign represents the same or same kind of member or process step and descriptions thereof is omitted as appropriate.

Light Emitting Module

Figure 1B:
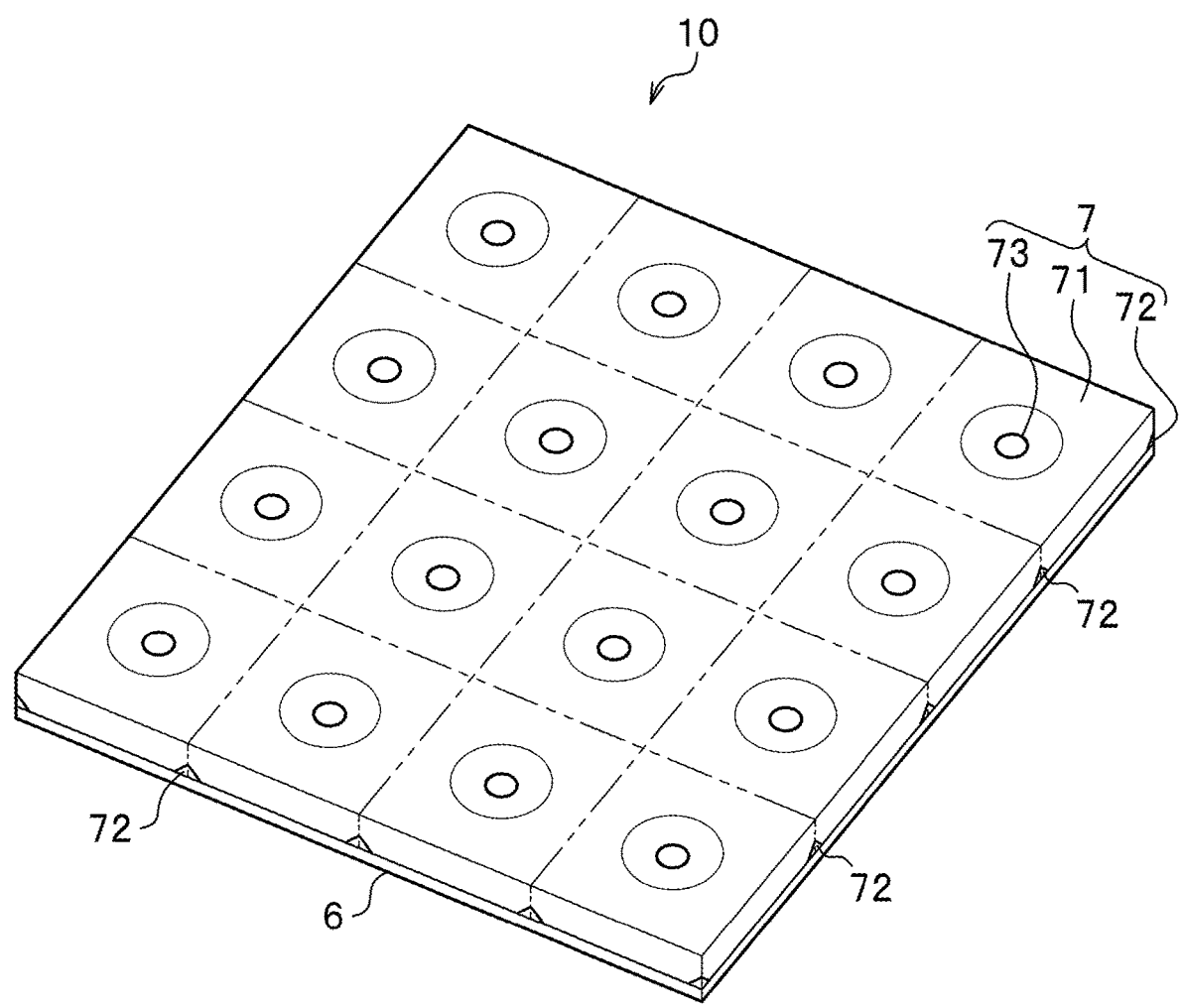
FIG. 1B is a perspective view schematically illustrating the external appearance of the light emitting module illustrated in FIG. 1A, as seen from below.
Figure 1C:
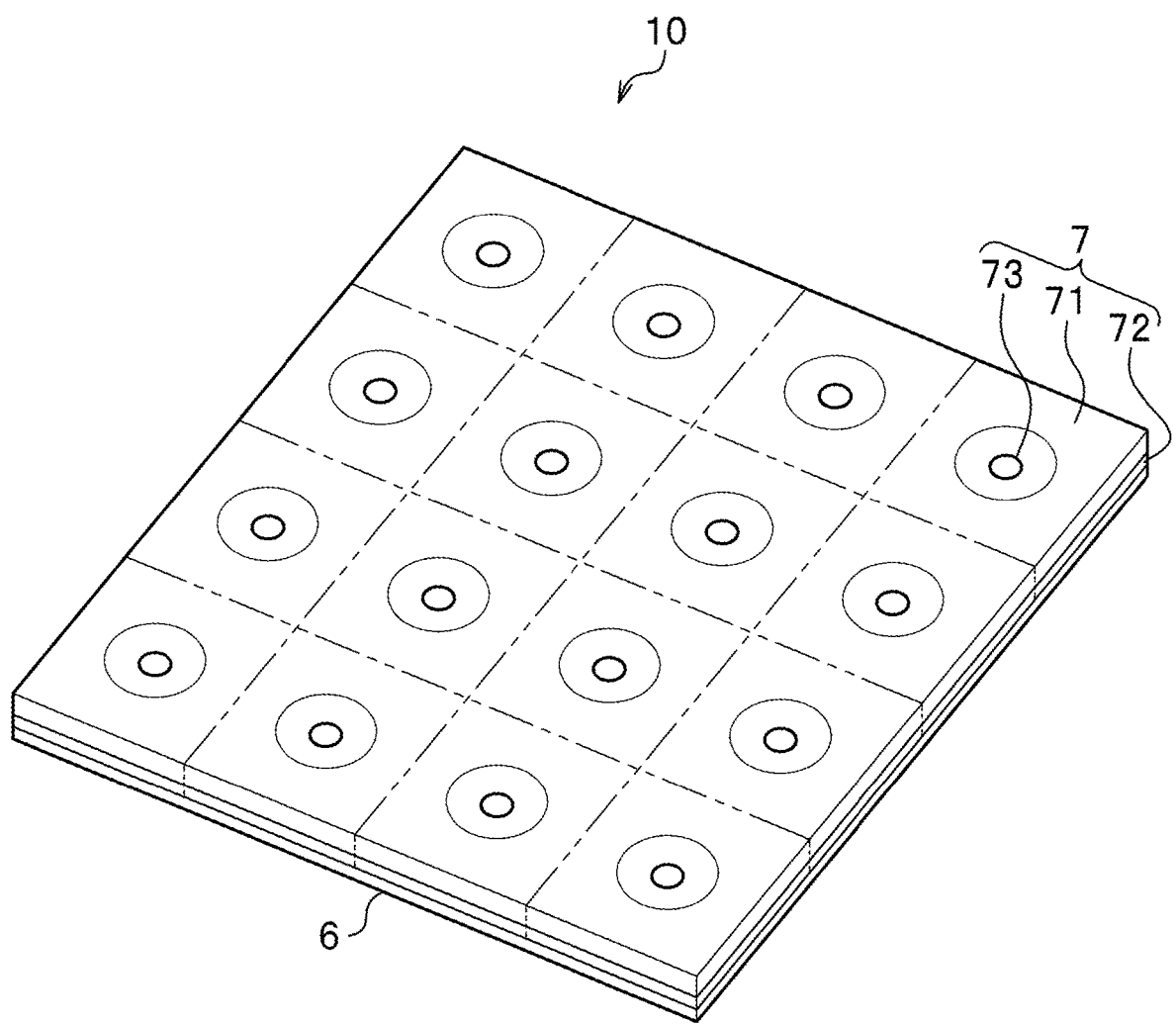
FIG. 1C is a perspective view schematically illustrating the external appearance of the light emitting module illustrated in FIG. 1A in a case in which the light emitting module is constructed using a light guide plate having light reflective parts having different shapes from those of the light emitting module illustrated in FIG. 1B, as seen from below.
Figure 1D:
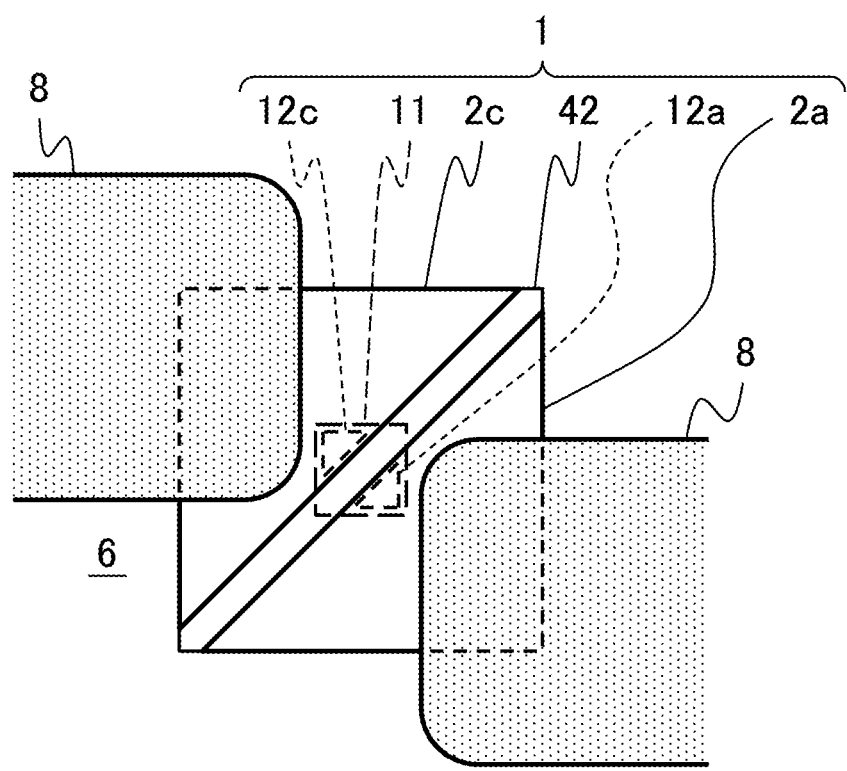
FIG. 1D is a partially enlarged view schematically illustrating the vicinity of a light emitting element illustrated in FIG. 1A.
Figure 1E:
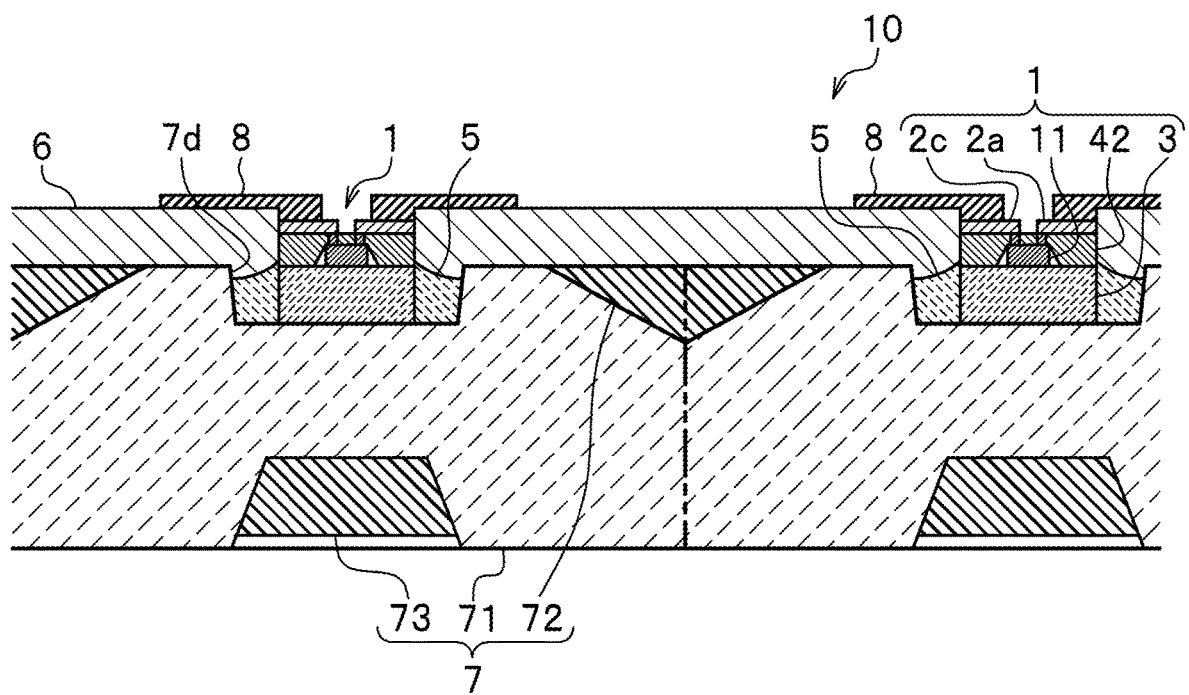
FIG. 1E is a schematic partial cross-sectional view taken along line IE-IE in FIG. 1A, when the light emitting module is constructed using the light guide plate illustrated in FIG. 1B.

A description will be given of a light emitting module according to an embodiment with reference to FIGS. 1A to 1E. FIG. 1A is a plan view schematically illustrating the external appearance of the light emitting module according to the embodiment. FIG. 1B is a perspective view schematically illustrating the external appearance of the light emitting module illustrated in FIG. 1A, as seen from below. FIG. 1C is a perspective view schematically illustrating the external appearance of the light emitting module illustrated in FIG. 1A in a case in which the light emitting module is constructed using a light guide plate having light reflective parts having different shapes from those of the light emitting module illustrated in FIG. 1B, as seen from below. FIG. 1D is a partially enlarged view schematically illustrating the vicinity of a light emitting element illustrated in FIG. 1A. FIG. 1E is a schematic partial cross-sectional view taken along line IE-IE in FIG. 1A, when the light emitting module is constructed using the light guide plate illustrated in FIG. 1B.

The light emitting module 10 includes: a light guide plate 7; a plurality of light emitting elements 11 disposed on the light guide plate 7 with gaps therebetween and each having an upper surface on which a pair of electrodes 12a and 12c are formed; first light reflective members 42 and a second light reflective member 6 which are formed between the plurality of light emitting elements 11 such that the upper surfaces of the pairs of electrodes 12a and 12c are exposed; pairs of metal films 2a and 2c, each pair formed on upper surfaces of a corresponding one of the pairs of electrodes 12a and 12c and on an upper surface of a corresponding one of the first light reflective members 42, the metal films 2a and 2c of each pair respectively formed on and connected to the upper surfaces of the corresponding pair of electrodes 12a and 12c; and wiring segments 8 formed on the upper surfaces of the pairs of metal films 2a and 2c and on an upper surface of the second light reflective member 6 so as to connect to at least partial areas of the pairs of metal films 2a and 2c. Each metal film 2a extends from the connected electrode 12a to an external area of the corresponding light emitting element 11 in a plan view; and each metal film 2c extends from the connected electrode 12c to an external area of the corresponding light emitting element 11 in a plan view.

The light emitting module 10 further includes, for each light emitting element 11: a light guiding member 41 disposed between the light emitting element 11 and the corresponding first light reflective member 42 and connected to a lateral surface of the light emitting element 11; and a light transmissive member 3 (see FIG. 2B) and a bonding member 5, which are disposed between the light emitting element 11 and the light guide plate 7 located on the lower side of the light emitting element 11.

The light emitting module 10 is a planar light emitting device to be used as a backlight or the like. The light emitting module 10 adjusts the light emitted by the light emitting elements 11 disposed with gaps therebetween so that the uniformity in the luminous intensity is obtained in a plane in the light guide plate 7 and emits the light to the light guide plate 7 side (downward in FIG. 1E). The shape and dimensions in a plan view of the light emitting module 10 can be selected as appropriate according to the use. In this embodiment, the light emitting module 10 has a rectangular shape in a plan view. The arrangement pitch of the light emitting elements 11 of the light emitting module 10 can be selected as appropriate according to the use of the light emitting module 10 and the brightness of the light emitting elements 11. The number of the light emitting elements 11 is determined according to the arrangement pitch and the dimensions of the light emitting module 10. For example, the light emitting module 10 is designed under the condition that the chip size of each light emitting element 11 is 100 μm to 200 μm and that the arrangement pitch of the light emitting elements 11, i.e., the center-to-center distance between adjacent light emitting elements 11, is 5 mm to 10 mm. Hereinafter, for the sake of simplicity, description will be given under the assumption that the light emitting module 10 has 16 light emitting elements 11 arranged in a 4×4 lattice form. In addition, a virtual rectangular region that is defined such that each of the light emitting elements 11 of the light emitting module 10 is centrally located in the region is called a cell. The boundary lines of the cells are virtually given to the light guide plate 7 as virtual lines in the drawings.

Figure 2A:
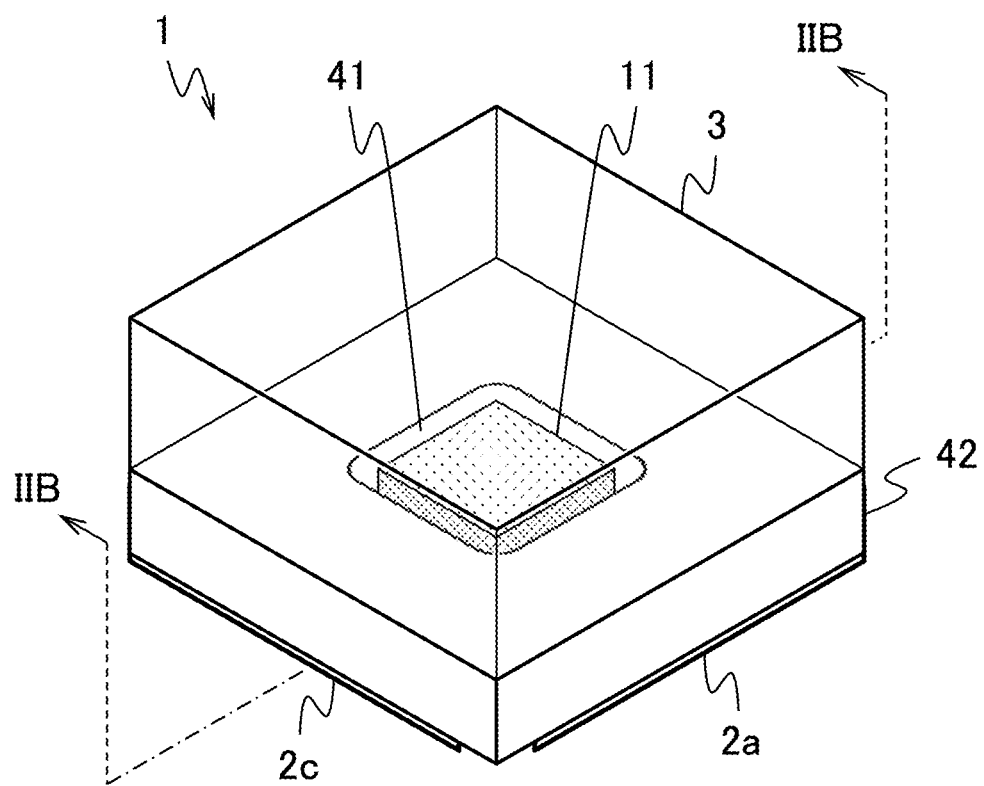
FIG. 2A is a perspective view schematically illustrating the external appearance of a light emitting device mounted on a light emitting module as seen from below.
Figure 2B:
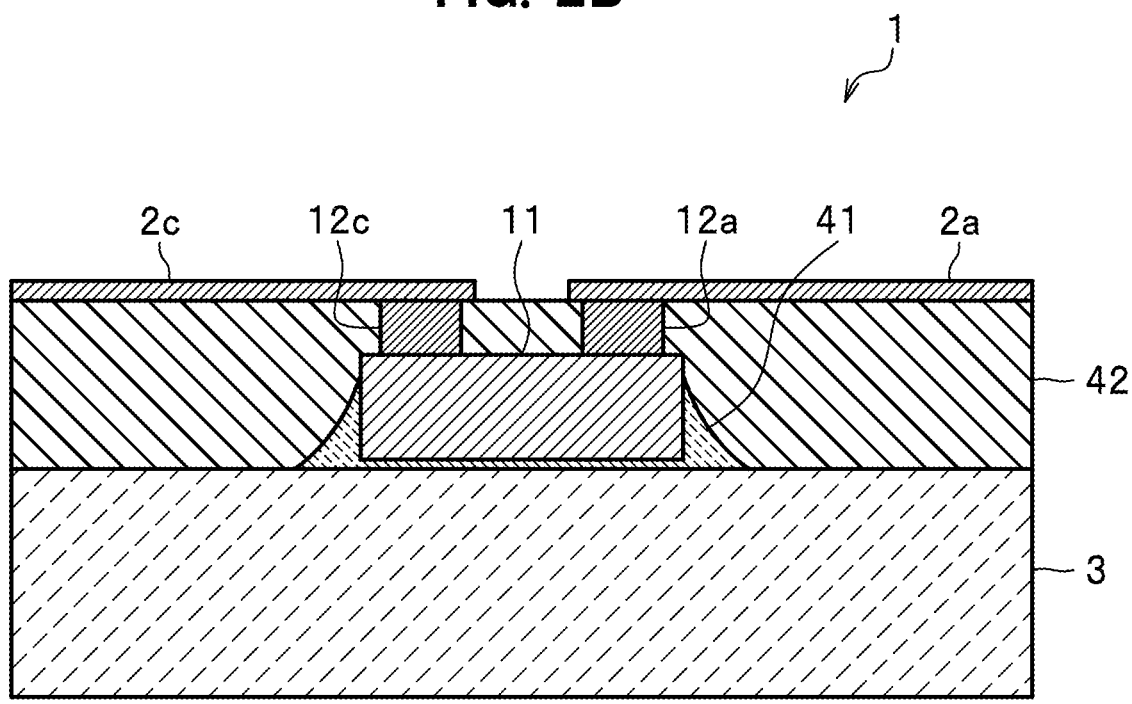
FIG. 2B is a cross-sectional view taken along line IIB-IIB in FIG. 2A.

The light emitting elements 11 disposed in the light emitting module 10 are each small compared to the overall dimension of the light emitting module 10 and to the arrangement pitch of the light emitting elements 11. For this reason, as described below in the description of the manufacturing method, the light emitting module 10 is fabricated by arranging light emitting devices 1, in each of which one light emitting element 11 is covered by the first light reflective member 42 and the like, on the light guide plate 7. Hereinafter, a description will be given of the light emitting device 1 and the constituent members thereof with reference to FIGS. 2A, 2B, 1B, and 1C. FIG. 2A is a perspective view schematically illustrating the external appearance of a light emitting device 1 mounted on a light emitting module as seen from below. FIG. 2B is a cross-sectional view taken along line IIB-IIB in FIG. 2A. It should be noted that in FIG. 2A, the light transmissive member 3 and the light guiding member 41 are represented as being transparent and drawn by outlines only.

Light Emitting Device

A light emitting device 1 may include: a light emitting element 11 with an upper surface and a lower surface opposite to the upper surface, on which upper surface a pair of electrodes 12a and 12c is formed; a plate-like light transmissive member 3 bonded to the lower surface of the light emitting element 11; a light guiding member 41 bonding the light transmissive member 3 and the light emitting element 11 and covering the lateral surfaces of the light emitting element 11; a first light reflective member 42 covering the light emitting element 11 and the light guiding member 41; and metal films 2a and 2c provided on a side opposite to the light transmissive member 3 and respectively connected to the electrodes 12a and 12c. The light emitting device 1 is a chip scale package (CSP) including fan out and emits light to the side of the light transmissive member 3. The light emitting device 1 is formed substantially in the shape of a rectangular parallelepiped and has substantially the shape of a square in a plan view. For example, the light emitting device 1 is designed such that the side of the square is about one-tenth the arrangement pitch of the light emitting module 10. Hereinafter, description will be given under the definition that the light transmissive member 3 side of the light emitting device 1 is the lower side thereof and the surface where the metal films 2a and 2c are located is the upper surface of the light emitting device 1.

The light emitting element 11 may be a semiconductor light emitting element and may include the electrodes 12a and 12c on the upper surface and emits light mainly from the lower surface and the lateral surfaces. Preferably, the light emitting element is a semiconductor light emitting element to be flip-chip mounted. The shape and dimensions of the light emitting element 11 are selected as appropriate. As an example, the light emitting element 11 has substantially the shape of a square in a plan view. The light emitting element 11 is not limited with regard to the emission color. A light emitting element capable of emitting light having a wavelength according to the use of the light emitting module 10 can be selected as the light emitting element 11. As an example of a blue-light emitting element having a peak emission wavelength within a range from 430 nm to 470 nm, an InGaN-based nitride semiconductor such as $In_XAl_YGa_{1-X-Y}N$ ($0 \leq X \leq 1$, $0 \leq Y \leq 1$, $X+Y \leq 1$) can be used. The light emitting elements 11 of the light emitting devices 1 of the light emitting module 10 may have different emission colors from one another.

The electrodes 12a and 12c are a pair of anode and cathode for supplying current to the light emitting element 11 and are pad electrodes formed of Cu or Au or the like. As an example, the electrodes 12a and 12c are arranged side by side along a diagonal line of the square shape of the light emitting element 11 in a plan view and each have substantially the shape of a right triangle in a plan view.

The light transmissive member 3 may be a plate-like member having substantially the shape of a rectangle in a plan view, which is substantially the same as the shape of the light emitting device 1 in a plan view. The light transmissive member 3 is located on the lower side of the light emitting device 1 and is formed of a material that is transmissive to the light emitted by the light emitting element 11. For example, the light transmissive member 3 is formed of a thermoplastic resin, examples of which include acrylics, polycarbonates, cyclic polyolefins, polyethylene terephthalates, and polyesters, or formed of a thermosetting resin, examples of which include epoxies and silicones, or formed of glasses. The light transmissive member 3 may contain a phosphor serving as a wavelength conversion member to allow the light emitting device 1 to emit light having a desired color according to the use of the light emitting module 10. The phosphor may be distributed in the resin material of the light transmissive member 3. The phosphor may be sintered with an inorganic material such as a glass.

The light guiding member 41 may be an adhesive for bonding the light emitting element 11 to the light transmissive member 3 and is formed of a material that is transmissive to the light emitted by the light emitting element 11. The light guiding member 41 includes a portion between the light emitting element 11 and the light transmissive member 3 located under the light emitting element 11 and includes a portion covering the lateral surfaces of the light emitting element 11 and forming a fillet that spreads on the light transmissive member 3. Preferably, the light guiding member 41 has insulation properties and is formed of a fluid material that can be cured at the heat resistant temperature of the light emitting element 11 or lower. For example, the light guiding member 41 is formed of a thermosetting resin, examples of which include epoxies and silicones, or is formed of a glass material or the like for encapsulating a semiconductor element. The light guiding member 41 may contain a phosphor serving as a wavelength conversion member.

The first light reflective member 42 reflects light emitted by the light emitting element 11 and allows the reflected light to come out from the light transmissive member 3. The first light reflective member 42 covers the light emitting element 11 and the light guiding member 41 with the upper surfaces of the electrodes 12a and 12c being exposed. Preferably, the first light reflective member 42 has insulation properties and is formed of a fluid material that can be cured at the heat resistant temperature of the light emitting element 11 or lower. For example, the first light reflective member 42 can be formed of a material composed of the thermosetting resin or the glass material presented above as the material of the light guiding member 41 and an additive of a light reflective substance such as titanium oxide ($TiO_2$).

The metal film 2a serves as an external connection terminal of the light emitting device 1. The metal film 2a is connected to the upper surface of the electrode 12a of the light emitting element 11 to serve as an extended terminal of the electrode 12a. Similarly, the metal film 2c serves as an external connection terminal of the light emitting device 1. The metal film 2c is connected to the upper surface of the electrode 12c of the light emitting element 11 to serve as an extended terminal of the electrode 12c. The metal films 2a and 2c are, in a plan view, each formed substantially in the shape of a right triangle that is similar to the shape of each of the electrodes 12a and 12c. The metal films 2a and 2c are, in a plan view, arranged side by side along a diagonal line of the square shape of the light emitting device 1, with the hypotenuses of the right triangles being opposed to each other. With the shape and arrangement, the metal films 2a and 2c are respectively connected to the electrodes 12a and 12c without short circuiting. The metal films 2a and 2c serve as electrodes with a large area and can be easily formed. The metal films 2a and 2c may be formed of a metal such as Cu or Ni that is generally used for wiring and may each be formed by stacking two or more kinds of metal films.

Light Guide Plate

The light guide plate 7 is an optical member configured to efficiently emit the light emitted by the light emitting elements 11, which are arranged on the upper surface of the light guide plate 7 with gaps therebetween, in a downward direction in a manner in which the uniformity of light is obtained in a plane. For that purpose, the light guide plate 7 may include a light transmissive part 71, light reflective parts 72, and light shielding parts 73 as illustrated in either FIG. 1B or FIGS. 1C and 1n FIG. 1E.

The light transmissive part 71 may be formed of a material transmissive to the light emitted by the light emitting elements 11 and may be formed in a plate shape with opposite surfaces in each of which recessed portions are formed relative to the positions of the light emitting elements 11. The upper surface of the light transmissive part 71 has circular cone-shaped recessed portions or quadrangular pyramid-shaped recessed portions each of which has the deepest point at the intersection point of the intersecting boundary lines of four adjacent cells (see FIG. 1B). Alternatively, the upper surface of the light transmissive part 71 has groove-shaped recessed portions each extending along a boundary line of two adjacent cells and each having a V-shaped cross section whose deepest point is on the boundary line (see FIG. 1C). The upper surface of the light transmissive part 71 has light emitting element placement cavities 7d formed therein to respectively house the light emitting devices 1, each substantially at the center of the corresponding cell. Preferably, each light emitting element placement cavity 7d is defined by a bottom surface which can encloses the corresponding light emitting device 1 in a plan view. Preferably, the bottom surface is not too large compared to the dimensions of the corresponding light emitting device 1 in a plan view. In addition, it is preferable that each light emitting element placement cavity 7d has a depth that is less than or equal to the thickness of the light emitting device 1, and it is more preferable that the depth be less than or equal to the thickness of the light transmissive member 3. The lower face of the light transmissive part 71 has recessed portions each having substantially the shape of a circular truncated cone substantially at the center of the corresponding cell. The light transmissive part 71 can be formed of any one of the materials presented above as examples of the material of the light transmissive member 3 of the light emitting device 1.

Each light reflective part 72 covers a part of the upper surface of the light transmissive part 71 and reflects the light having passed through the light transmissive part 71 and reached the surface of the part of the light transmissive part 71 to allow the reflected light to come out from the lower surface of the light transmissive part 71. The light reflective parts 72 are disposed in the circular cone-shaped recessed portions, quadrangular pyramid-shaped recessed portions or groove-shaped recessed portions formed in the upper surface of the light transmissive part 71 so as to flatten the upper surface of the light guide plate 7 except the light emitting element placement cavities 7d. The light reflective parts 72 each have a shape in conformance with the shape of the corresponding recessed portion. When the recessed portions in the upper surface of the light transmissive part 71 are formed in the shape of a circular cone, each of the light reflective parts 72 disposed in a recessed portion in the upper surface has the shape of a circular cone whose deepest point is at the intersection point of intersecting boundary lines of four cells two-dimensionally adjacent to each other on the upper surface of the light transmissive part 71 (see FIG. 1E), each of the light reflective parts 72 disposed in a recessed portion located at a lateral end of the light transmissive part 71 has the shape of a half circular cone whose deepest point is at the point where a common boundary line of two adjacent cells intersects the lateral end at a right angle (see FIG. 1B), and each of the light reflective parts 72 disposed in a recessed portion located at a corner of the light transmissive part 71 has the shape of a downward quarter circular cone whose deepest point is at the apex point of the corner (see FIG. 1B). When the recessed portions in the upper surface of the light transmissive part 71 are formed in the shape of a quadrangular pyramid, each of the light reflective parts 72 disposed in a recessed in the upper surface has the shape of a quadrangular pyramid whose deepest point is at the intersection point of the intersecting boundary lines of four cells two-dimensionally adjacent to each other in the upper surface of the light transmissive part 71 (see FIG. 1E) and whose four ridgelines overlap the intersecting boundary lines in a plan view, each of the light reflective parts 72 disposed in a recessed portion located at a lateral end of the light transmissive part 71 has the shape of a triangular pyramid which is resulted in dividing a quadrangular pyramid to halves by a plane passing two ridgelines of the quadrangular pyramid and whose deepest point is at the point where a common boundary line of two adjacent cells intersects the lateral end at a right angle (see FIG. 1B), and each of the light reflective parts 72 disposed in a recessed portion located at a corner of the light transmissive part 71 has the shape of a downward triangular pyramid which is resulted in dividing a quadrangular pyramid to quarters by two planes each passing two ridgelines of the quadrangular pyramid and being orthogonal to each other and whose deepest point is at the apex point of the corner (see FIG. 1B). When the recessed portions in the upper surface of the light transmissive part 71 are formed in the shape of a groove, the light reflective parts 72 disposed in the recessed portions are each formed in the shape of a triangular prism having a triangular cross section and are arranged at the arrangement pitch of the light emitting elements 11 and connected in a lattice form with their apexes being oriented downward (see FIG. 1C). The light reflective parts 72 can be formed of any one of the materials presented above as examples of the material of the first light reflective member 42 of the light emitting device 1.

Each light shielding part 73 is located directly below the corresponding light emitting element 11 to inhibit strong light coming from the light emitting element 11 from being emitted vertically downward directly. The light shielding parts 73 are disposed in the recessed portions formed in the lower face of the light transmissive part 71 and are each formed substantially in the shape of a circular truncated cone whose size is about the same as the light emitting device 1 in a plan view. Preferably, the light shielding part 73 reflects light and thus can be formed of any one of the materials presented above as examples of the material of the first light reflective member 42. Alternatively, the light shielding part 73 may be configured to reflect a part of the light and transmit the other part of the light.

With this configuration of the light guide plate 7, the light emitted from each light emitting element 11 in the lateral direction passes through the light transmissive part 71 and reaches the adjacent light reflective part 72 and is reflected downward. As a result, the amount of the light coming out from a region between adjacent light emitting elements 11 increases. In addition, with the configuration of the light guide plate 7, as the light shielding parts 73 are respectively located directly below the light emitting devices 1, light emitted from the light emitting device 1 is unlikely to exit with strong intensity in a pattern of dots corresponding to the light emitting devices 1.

The light transmissive part 71 may have an optical function such as that of a lens by combining a plurality of materials having different refractive indices. The recessed portions of the upper and lower surfaces of the light transmissive part 71 may each have a spherical interior surface. The interior surfaces of the recessed portions in the upper surface of the light transmissive part 71 may each be formed substantially in the shape of a Fresnel lens. In such a case, the light reflective parts 72 and the light shielding parts 73 are formed in conformance with those surfaces. The light reflective parts 72 and the light shielding parts 73 are each only required to cover at least the interior surface of the corresponding recessed portion of the light transmissive part 71 and therefore may each be in the form of a film. The light guide plate 7 is not necessarily provided with the light emitting element placement cavities 7d in the upper surface.

Bonding Member

Each bonding member 5 may be an adhesive for bonding the corresponding light emitting device 1 to the light guide plate 7 and may be formed of a material transmissive to the light emitted by the light emitting element 11. In this embodiment, as the light emitting element placement cavities 7d are formed in the light guide plate 7, it is preferable that the bonding member 5 be not only provided between the inner upper surface of the light guide plate 7 defining the corresponding light emitting element placement cavity 7d and the lower surface of the corresponding light emitting device 1 but also supplied in the corresponding light emitting element placement cavity 7d to cover lateral surfaces of a lower portion of the corresponding light emitting device 1 so that the entire of the lateral surfaces of the corresponding light transmissive member 3 is covered by the bonding member 5. The bonding member 5 is preferably formed of a fluid material that can be cured at the heat resistant temperature of the light emitting device 1 and the light guide plate 7 or lower and thus may be formed of any one of the materials presented above as examples of the material of the light guiding member 41 of the light emitting device 1.

Second Light Reflective Member

The second light reflective member 6 may be an insulative member that is supplied in the gaps between the light emitting devices 1 on the light guide plate 7 to flatten the surface on which wiring segments 8 are to be formed and insulates between the wiring segments 8. The second light reflective member 6 covers the bonding members 5 and the light transmissive part 71 exposed on the upper surface of the light guide plate 7 to inhibit the light from leaking upward and reflect the light to allow the reflected light to come out downward. The second light reflective member 6 is preferably formed of a fluid material that can be cured at the heat resistant temperature of the light emitting device 1 and the light guide plate 7 or lower and thus can be formed of any one of the materials presented above as examples of the material of the first light reflective member 42 of the light emitting device 1.

Wiring Segment

The wiring segments 8 may be formed on the upper surfaces of the metal films 2a and 2c and on the upper surface of the second light reflective member 6 to electrically connect between the light emitting elements 11 via the metal films 2a and 2c, in order to supply current to the light emitting elements 11 from the outside. As illustrated in FIG. 1A, the wiring segments of the light emitting module 10 connect sets of two light emitting elements 11 each in series and connect the sets of two light emitting elements 11 in parallel. The wiring segments 8 include large-area regions respectively located on the anode and cathode sides as external connection pads. The pattern of the wiring segments 8 is formed by printing as described in the description given below of the fabrication method. For this reason, the wiring segments 8 are formed of a conductive paste composed of a mixture of a thermosetting resin material and a metal filler such as silver and copper. The thicker the wiring segments 8, the reliability of the light emitting module 10 increases, but with an increased production cost. Specifically, the thickness of the wiring segments 8 is preferably in a range from about 1 µm to about 50 µm, more preferably in a range from about 3 µm to about 50 µm, and still more preferably in a range from about 5 µm to about 50 µm.

The wiring segments 8 are connected to the metal films 2a and 2c with sufficient areas to ensure good conductivity in the connection with the light emitting elements 11. The pattern of the wiring segments 8 is determined so as not to short-circuit the metal films 2a and 2c of each light emitting device 1. The wiring segments 8 are formed in a pattern extending over the light emitting module 10 by a mask prepared in advance. In the case of the light emitting module 10, the wiring segments 8 include rows of two left-right pairs of segments each of which is arranged side by side in the left-right direction and the rows are spaced apart from one another in the column direction so that each left-right pair of segments is arranged to be respectively connected to the metal films 2a and 2c of a corresponding one of the light emitting devices 1. With this pattern of the wiring segments 8, they can be formed to be connected with the metal films 2a and 2c with sufficient areas and not to short circuit the metal films 2a and 2c, even when the light emitting devices 1 are positioned with a certain degree of deviation.

Method for Manufacturing Light Emitting Module

Figure 3:
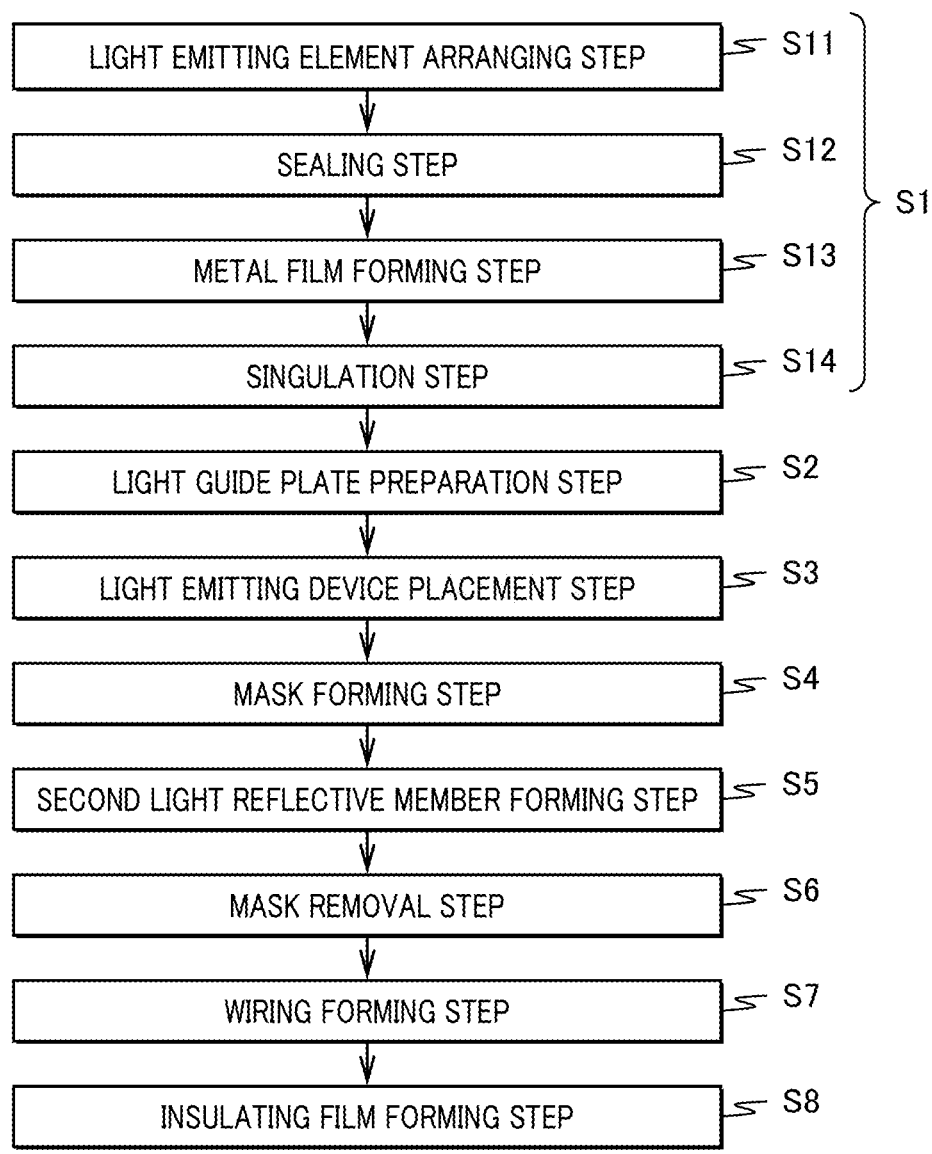
FIG. 3 illustrates a flowchart of a method for manufacturing a light emitting module according to the embodiment.

A description will be given of a method for manufacturing a light emitting module according to the embodiment with reference to FIG. 3. FIG. 3 illustrates a flowchart of a method for manufacturing a light emitting module according to the embodiment. The method for manufacturing the light emitting module may include: a provision step S1 of providing light emitting devices 1 each having a surface on which metal films 2a and 2c are formed to be connected to electrodes 12a and 12c of a light emitting element 11; a light emitting device placement step S3 of placing the light emitting devices 1 on a light guide plate 7 with gaps between the light emitting devices 1, with the metal films 2a and 2c of each light emitting device 1 being located on the upper side; a mask forming step S4 of forming a mask that covers the metal films 2a and 2c; a second light reflective member forming step S5 of forming a second light reflective member 6 on the light guide plate 7, in the gaps between the light emitting devices 1; a mask removal step S6 of removing the mask; and a wiring forming step S7 of forming wiring segments 8 on the light emitting devices 1 and the second light reflective member 6, the wiring segments 8 connecting with the metal films 2a and metal films 2c. The method for manufacturing the light emitting module further includes a light guide plate provision step S2 of providing the light guide plate 7. The light guide plate provision step S2 is performed before the light emitting device placement step S3. Hereinafter, each step is described in detail.

Provision Step

Figure 4A:
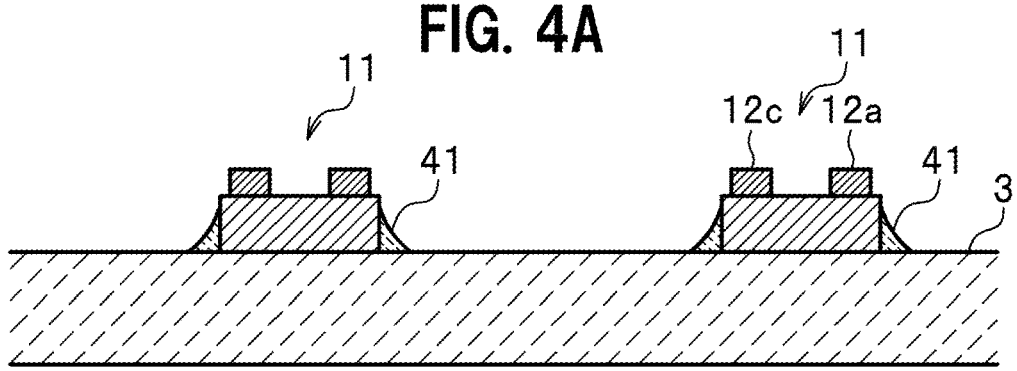
FIG. 4A is a partial cross-sectional view illustrating a state in which light emitting elements are arranged on and bonded to a layer for light transmissive members in a provision step of the method for manufacturing the light emitting module according to the embodiment.
Figure 4B:
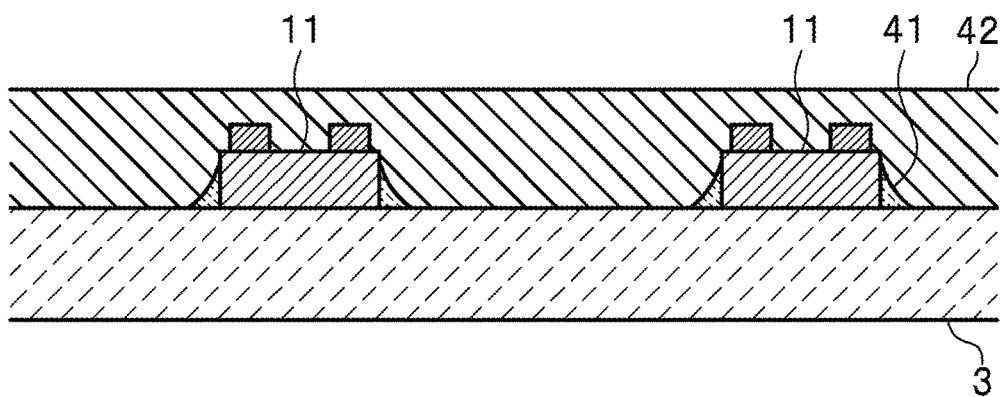
FIG. 4B is a partial cross-sectional view illustrating a state in which the light emitting elements are covered by a layer for first light reflective members in a provision step of the method for manufacturing the light emitting module according to the embodiment.
Figure 4C:
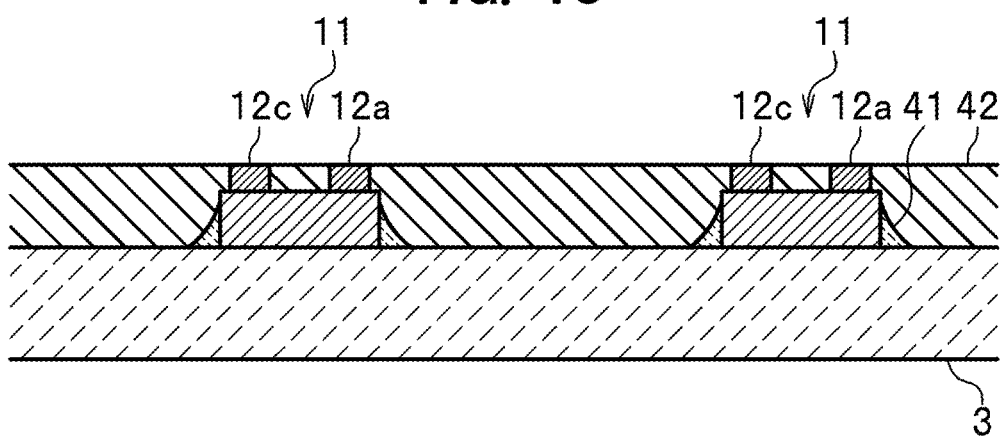
FIG. 4C is a partial cross-sectional view illustrating a state in which the layer for first light reflective members has been ground so as to expose electrodes of the light emitting elements in a provision step of the method for manufacturing the light emitting module according to the embodiment.
Figure 4D:
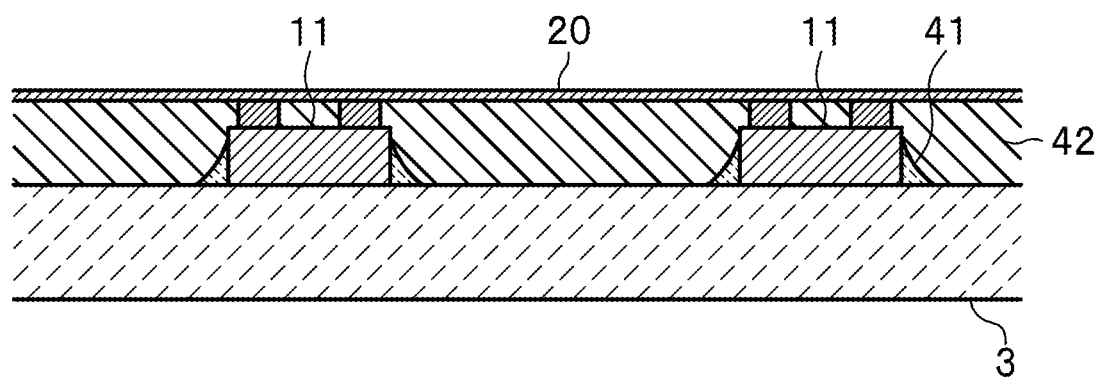
FIG. 4D is a partial cross-sectional view illustrating a state in which a metal film has been formed in a provision step of the method for manufacturing the light emitting module according to the embodiment.
Figure 4E:
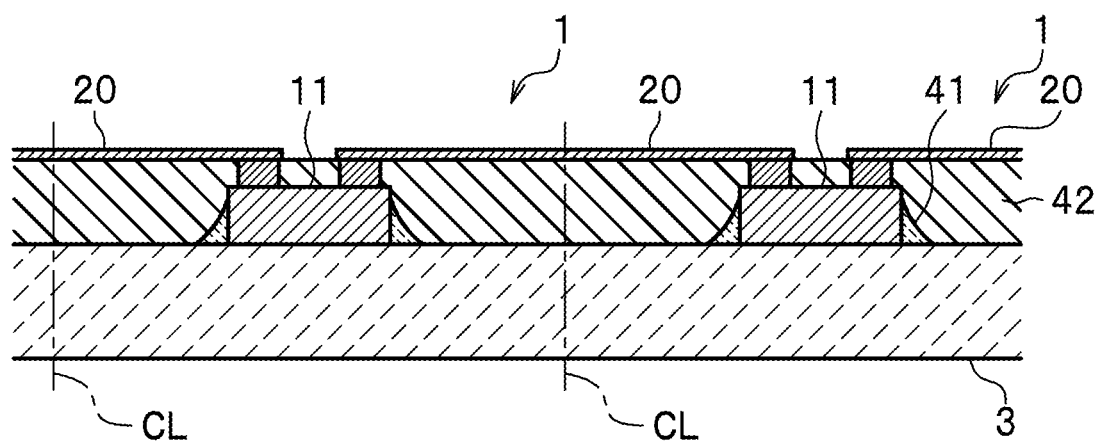
FIG. 4E is a partial cross-sectional view illustrating a state before singulation of light emitting devices is to be carried out in a provision step of the method for manufacturing the light emitting module according to the embodiment.

A description will be given of the provision step S1 with reference to FIGS. 3 and 4A to 4E. FIG. 4A is a partial cross-sectional view illustrating a state in which light emitting elements are arranged on and bonded to a layer for light transmissive members in a provision step of the method for manufacturing the light emitting module according to the embodiment. FIG. 4B is a partial cross-sectional view illustrating a state in which the light emitting elements are covered by a layer for first light reflective members in the provision step of the method for manufacturing the light emitting module according to the embodiment. FIG. 4C is a partial cross-sectional view illustrating a state in which the layer for first light reflective members has been ground so as to expose electrodes of the light emitting elements in the provision step of the method for manufacturing the light emitting module according to the embodiment. FIG. 4D is a partial cross-sectional view illustrating a state in which a metal film has been formed in the provision step of the method for manufacturing the light emitting module according to the embodiment. FIG. 4E is a partial cross-sectional view illustrating a state before singulation of the light emitting devices is to be carried out in the provision step of the method for manufacturing the light emitting module according to the embodiment.

The provision step S1 provides the light emitting devices 1 illustrated in FIGS. 1D, 2A, and 2B. The provision step S1 may include: a light emitting element arranging step S11 of arranging and bonding light emitting elements 11 onto a layer for light transmissive members 3; a encapsulating step S12 of encapsulating the light emitting elements 11 with a layer for first light reflective members 42; a metal film forming step S13 of forming metal films 2a and metal films 2c; and a singulation step S14 of singulating connected light emitting devices 1. In the provision step S1, a plurality of light emitting devices 1 may be fabricated in a state of being connected and arranged in a two-dimensional array. The plurality of light emitting devices 1 may be finally singulated by cutting.

In the light emitting element arranging step S11, as illustrated in FIG. 4A, the light emitting elements 11 may be disposed on the layer for light transmissive members 3 in a two-dimensional array with a predetermined pitch and then bonded thereto with light guiding members 41. The arrangement pitch of the light emitting elements 11 may be determined taking into account the size of each light emitting device 1 in a plan view and the margin for the cutting along cutting lines in the singulation step S14. In this embodiment, as each light emitting device 1 has substantially the shape of a square in a plan view, the light emitting elements 11 are arranged substantially in a square lattice pattern. The size of the layer for light transmissive members 3 may be determined according to the arrangement pitch and the number of the light emitting elements 11. A predetermined amount of the material of the light guiding members 41 before being cured is dropped at each of the places where the light emitting elements 11 are to be placed on the layer for light transmissive members 3. Subsequently, the light emitting elements 11 are placed on the material of the light guiding members 41, with the electrodes 12a and 12c facing upward. Then, the material of the light guiding members 41 is cured under a condition that is suitable to the material. It should be noted that the number of the light emitting elements 11 per the layer for light transmissive members 3, i.e., the number of the light emitting devices 1, is not limited.

The encapsulating step S12 forms a first light reflective members 42 that encapsulates the light emitting elements 11 with the electrodes 12a and 12c of the light emitting elements 11 being exposed from the upper surface of the layer for first light reflective members 42. As illustrated in FIG. 4B, the material of the layer for first light reflective members 42, which is before being cured, is supplied on the layer for the light transmissive members 3 so as to completely cover the light emitting elements 11 and the light guiding members 41. Then, the material of the layer for first light reflective members 42 is cured under a condition that is suitable to the material. Subsequently, the layer for first light reflective members 42 is ground from an upper surface thereof to expose the electrodes 12a and electrodes 12c from the upper surface as illustrated in FIG. 4C. In this event, the electrodes 12a and electrodes 12c may be thinned by being ground together with the layer for first light reflective members 42 to a certain degree but in such a way that the electrodes 12a and 12c remain with a sufficient thickness.

The metal film forming step S13 forms a metal film 20 on the upper surface and processes the metal film 20 into metal films 2a and metal films 2c. As illustrated in FIG. 4D, a metal film 20 is formed on the entire of the upper surfaces of the layer for first light reflective members 42, electrodes 12a, and electrodes 12c. The metal film 20 may be formed by a method suitable to the material and film thickness, such as sputtering or vapor deposition. Subsequently, as illustrated in FIG. 4E, the metal film 20 is partially removed to remove portions thereof each extending along the gap between the pair of electrodes 12a and 12c of a corresponding one of the light emitting elements 11 so that the layer for first light reflective members 42 is exposed from the gap. As the electrodes 12a and 12c of each light emitting element 11 are aligned along a diagonal line of the light emitting element 11, the metal film 20 is partially removed from a strip-shaped region whose center line is perpendicular to the diagonal line and whose width is defined by the gap between the electrodes 12a and 12c. The removal of the metal film 20 may be carried out by using a laser ablation process that irradiates the strip-shaped region with a laser beam. Alternatively, photolithography and etching may be carried out to remove the strip-shaped regions of the metal film 20, which each have a width equal to the size of the gap between each pair of electrodes 12a and 12c.

In the singulation step S14, the metal film 20, the layer for first light reflective members 42, and the layer for light transmissive members 3 are cut along the cutting lines CL illustrated in FIG. 4E to obtain singulated light emitting devices 1. The singulation step S14 may use a cutting method suitable to the materials and thicknesses of the metal film 20, the layer for first light reflective members 42, and the layer for light transmissive members 3. Examples of such a method include blade dicing and laser dicing. As a result of cutting the metal film 20 along the cutting lines CL, the metal film 20 is divided into separated metal films 2a and separated metal films 2c.

Figure 5A:
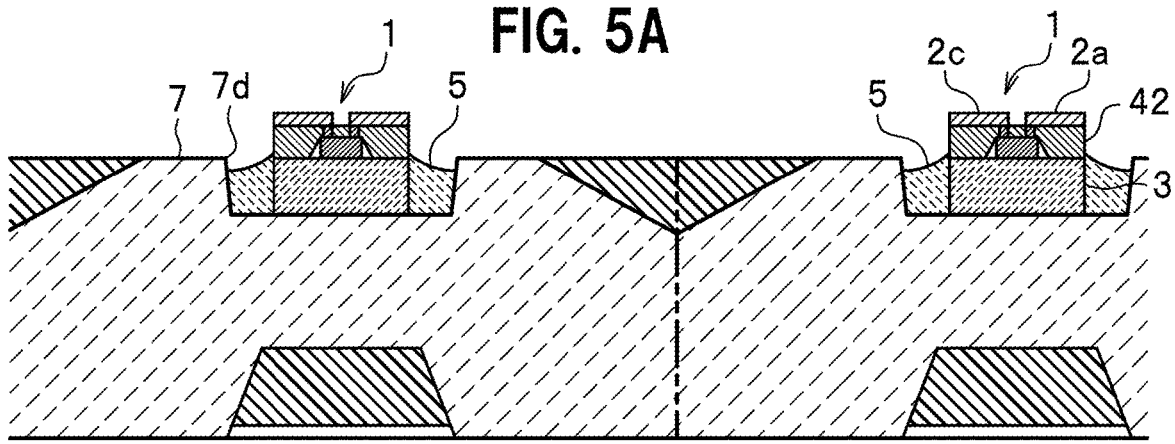
FIG. 5A is a partial cross-sectional view illustrating a light emitting device placement step of the method for manufacturing the light emitting module according to the embodiment.
Figure 5B:
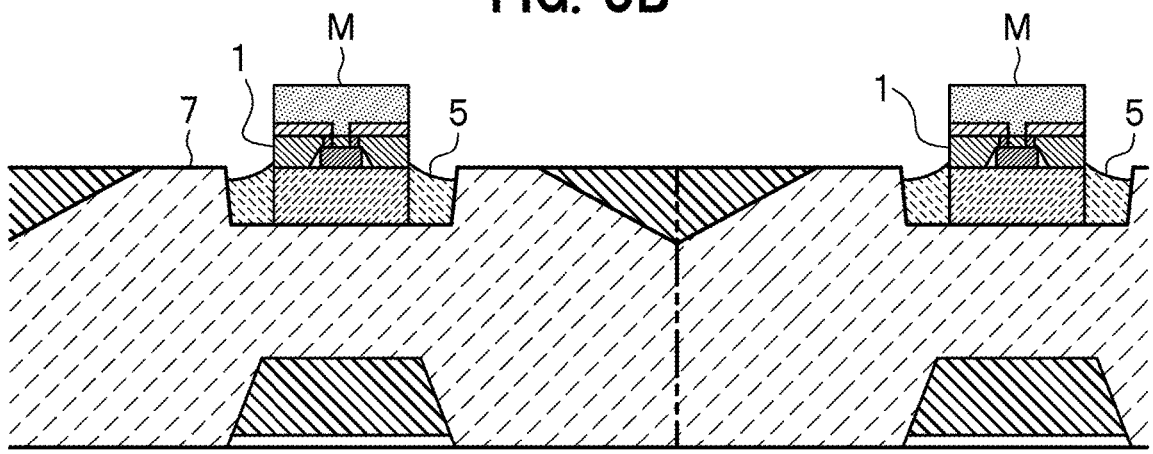
FIG. 5B is a partial cross-sectional view illustrating a mask forming step of the method for manufacturing the light emitting module according to the embodiment.
Figure 5C:
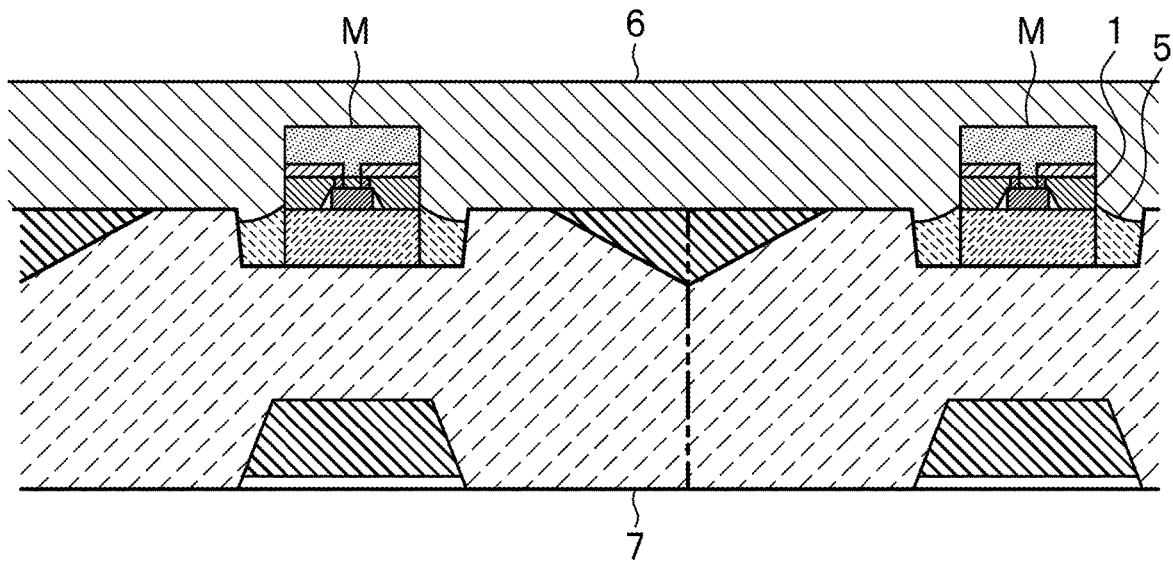
FIG. 5C is a partial cross-sectional view illustrating a state in which light emitting devices have been covered by a second light reflective member in a second light reflective member forming step of the method for manufacturing the light emitting module according to the embodiment.
Figure 5D:
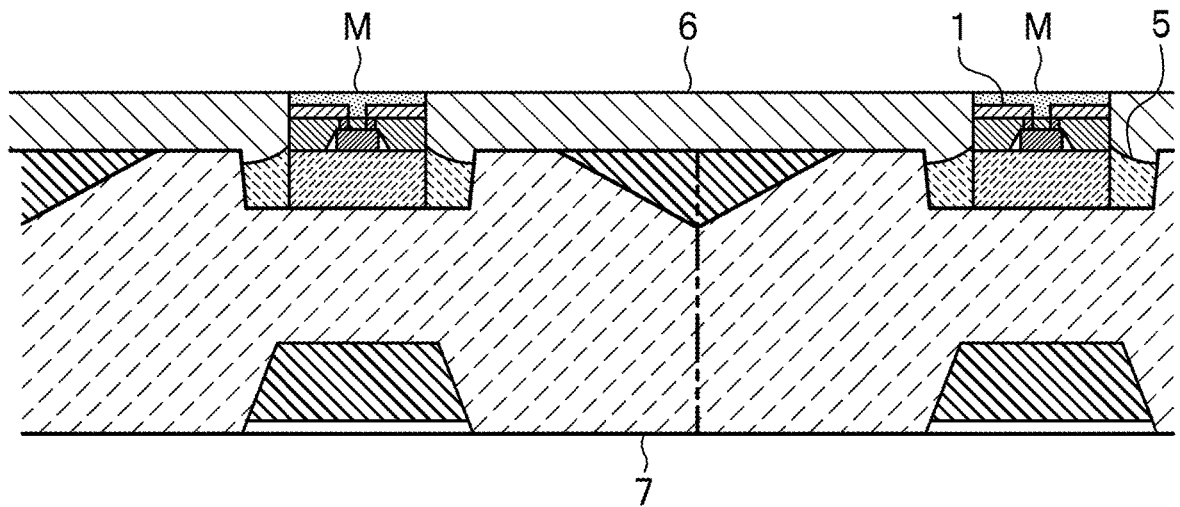
FIG. 5D is a partial cross-sectional view illustrating a state in which the second light reflective member has been ground so as to expose the mask in the second light reflective member forming step of the method for manufacturing the light emitting module according to the embodiment.
Figure 5E:
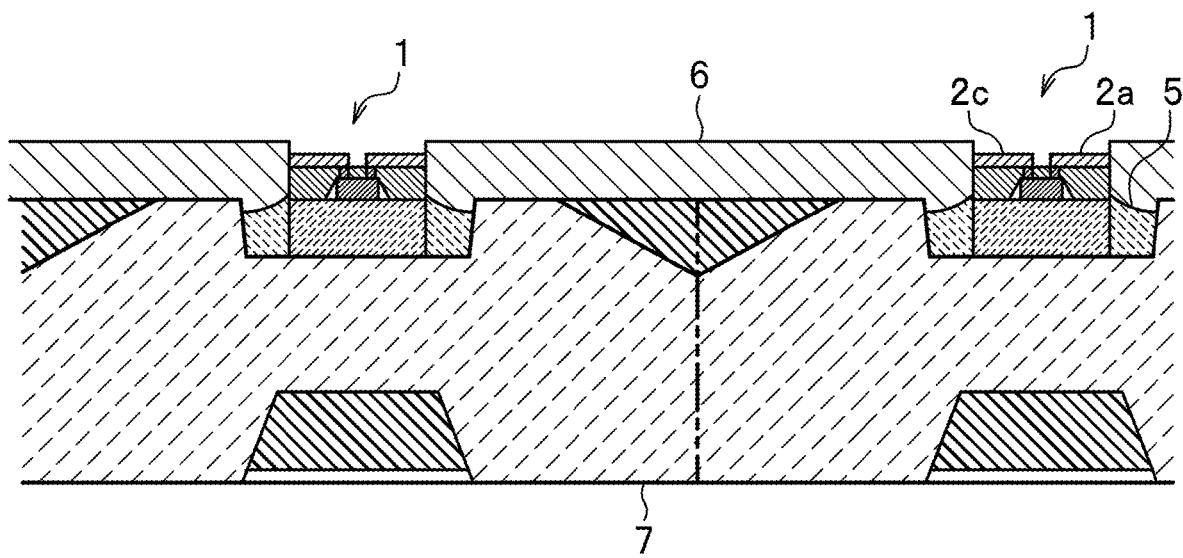
FIG. 5E is a partial cross-sectional view illustrating a mask removal step of the method for manufacturing the light emitting module according to the embodiment.

A description will be given of the subsequent steps with reference to FIGS. 3 and 5A to 5E. FIG. 5A is a partial cross-sectional view illustrating a light emitting device placement step of the method for manufacturing a light emitting module according to the embodiment. FIG. 5B is a partial cross-sectional view illustrating a mask forming step of the method for manufacturing the light emitting module according to the embodiment. FIG. 5C is a partial cross-sectional view illustrating a state in which light emitting devices have been covered by a second light reflective member in a second light reflective member forming step of the method for manufacturing the light emitting module according to the embodiment. FIG. 5D is a partial cross-sectional view illustrating a state in which the second light reflective member has been ground so as to expose the mask in the second light reflective member forming step of the method for manufacturing the light emitting module according to the embodiment. FIG. 5E is a partial cross-sectional view illustrating a mask removal step of the method for manufacturing the light emitting module according to the embodiment.

Light Guide Plate Provision Step

The light guide plate provision step S2 fabricates a light guide plate 7. For example, the light transmissive part 71 is formed by molding or by machining a plate-like member. Subsequently, the material of the light reflective parts 72 before being cured is supplied in the recessed portions, other than the light emitting element placement cavities 7d, of the upper face of the light transmissive part 71 and then cured. Then, the material of the light shielding parts 73 before being cured is supplied in the recessed portions of the lower face of the light transmissive part 71 and then cured.

Light Emitting Device Placement Step

In the light emitting device placement step S3, as illustrated in FIG. 5A, the light transmissive members 3 of the light emitting devices 1 are bonded to the bottom surfaces of the light emitting element placement cavities 7d formed in the upper surface side of the light guide plate 7 by the bonding members 5. Similar to the light emitting element arranging step S11, the material of the bonding members 5 before being cured is dropped in each light emitting element placement cavity 7d of the light guide plate 7 and the corresponding light emitting device 1 is placed on the dropped material with the metal films 2a and 2c thereof facing upward. After that, the material of the bonding members 5 is cured under a condition suitable for that material.

Mask Forming Step

As illustrated in FIG. 5B, the mask forming step S4 forms masks M that cover the upper surfaces of the light emitting devices 1. Preferably, the masks M, which cover the light emitting devices 1 disposed on the light guide plate 7, are formed by photolithography using a photosensitive film (dry-film resist (DFR)). Preferably, the thickness of the photosensitive film (resist layer) is in a range from about 10 µm to about 100 µm. The photosensitive film is laminated on the entire upper surface of the light guide plate 7 on which the light emitting devices 1 are mounted, while peeling off the cover film of the photosensitive film. Then, the photosensitive film is exposed through a carrier film to form a pattern and then the carrier film is peeled off from the photosensitive film. After that, development using an aqueous alkaline solution is carried out to form the masks M. The heat resistant temperature of the masks M is equal to or higher than the curing temperature of the second light reflective member 6. The shape of each mask M may be the same as the light emitting device 1 in a plan view or may be slightly smaller than the shape of the light emitting device 1 so that the mask M is unlikely to extend further to the outside of the light emitting device 1.

Second Light Reflective Member Forming Step

The second light reflective member forming step S5 forms the second light reflective member 6 in the gaps between the light emitting devices 1 on the light guide plate 7. Similar to the encapsulating step S12, as illustrated in FIG. 5C, the material of the second light reflective member 6 before being cured is supplied over the light guide plate 7 so as to completely cover the light emitting devices 1 and the masks M formed thereon and the bonding members 5. Then, the material of the second light reflective member 6 is cured under a condition suitable to the material. Subsequently, the cured material of the second light reflective member 6 is ground from the upper surface thereof to expose the masks M from the upper surface completely as illustrated in FIG. 5D. In this event, the masks M may be thinned together with the second light reflective member 6 to an extent where the metal films 2a and metal films 2c of the light emitting devices 1 located below the masks M are not exposed. Preferably, the remaining thickness of the masks M is equal to or less than the thickness of the wiring segments 8.

Mask Removal Step

In the mask removal step S6, the masks M covering the upper surfaces of the light emitting devices 1 may be removed with a stripping solution. As a result, as illustrated in FIG. 5E, the metal films 2a and metal films 2c are exposed. The upper surface of the workpiece becomes planar due to the ground surface of the second light reflective member 6, except the regions where steps are formed above the light emitting devices 1 by being recessed by the remaining thickness of the masks M.

Wiring Forming Step

The wiring forming step S7 forms wiring segments 8 on the second light reflective member 6 and metal films 2a and metal films 2c with, for example, a conductive paste (see FIGS. 1D and 1E). Preferably, the conductive paste is applied by screen-printing. The pattern is, for example, formed with a mask which is produced by forming an emulsion film on a screen mesh. After that, the conductive paste is cured under a condition suitable to the material thereof to produce the wiring segments 8.

The upper surface of the light emitting module 10 may be provided with an insulating film that covers the wiring segments 8, metal films 2a, and metal films 2c to protect them, in which case the insulating film is formed in an insulating film forming step S8, which is carried out after the wiring forming step S7. The insulating film may be a film formed of a polyimide and bonded with an adhesive, or a paint constituting the insulating film may be applied and dried. The insulating film may be provided over the entire of the upper surface except the external connection pads of the wiring segments 8 or may be patterned to cover the wiring segments 8, metal films 2a, metal films 2c, and the vicinities thereof. Alternatively, the insulating film may be patterned to include rectangle patterns respectively corresponding one-to-one to the light emitting devices 1 and each having a size slightly larger than the corresponding light emitting device 1 in a plan view such that the metal films 2a and 2c of the light emitting device 1 and their connection portions to the corresponding wiring segments 8 are covered by the rectangle pattern.

As understood from the foregoing, the method for manufacturing the light emitting module can manufacture a thin light emitting module with good connection reliability.

Modifications

In the metal film forming step S13 of the provision step S1, the metal film 20 may be partially removed to remove portions thereof along the cutting lines CL in addition to the strip-shaped regions along the gaps between the electrodes 12a and electrodes 12c. Accordingly, the singulation step S14 is only required to cut the layer for first light reflective members 42 and the layer for light transmissive members 3. The lateral surfaces of the light emitting element 11 of each light emitting device 1 may be directly covered by the corresponding first light reflective member 42. In this case, in the light emitting element arranging step S11 of the provision step S1, the amount of the material of the light guiding member 41 to be dropped is adjusted, or atomic diffusion bonding or the like is used to bond the light emitting elements 11 to the layer for light transmissive members 3 without using the light guiding members 41. Moreover, the light emitting devices 1 are not necessarily provided with the light transmissive members 3. In this case, for example, in the light emitting element arranging step S11 of the provision step S1, the light emitting elements 11 are arranged and fixed onto a chip fixing tape for manufacturing packages. Then, after the encapsulating step S12, the chip fixing tape is peeled off from the light emitting elements 11 and the layer for first light reflective members 42 formed.

Figure 6A:
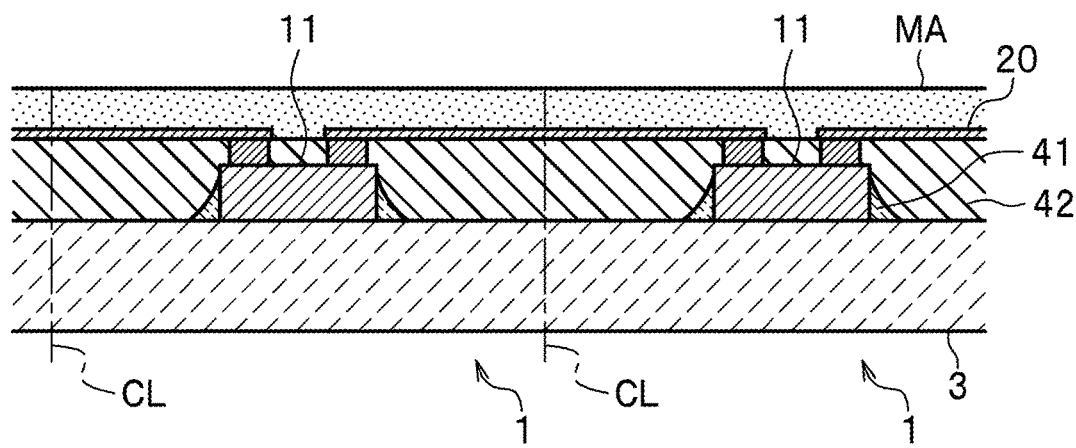
FIG. 6A is a partial cross-sectional view of a mask forming step of a modification of the manufacturing method of the light emitting module according to the embodiment.
Figure 6B:
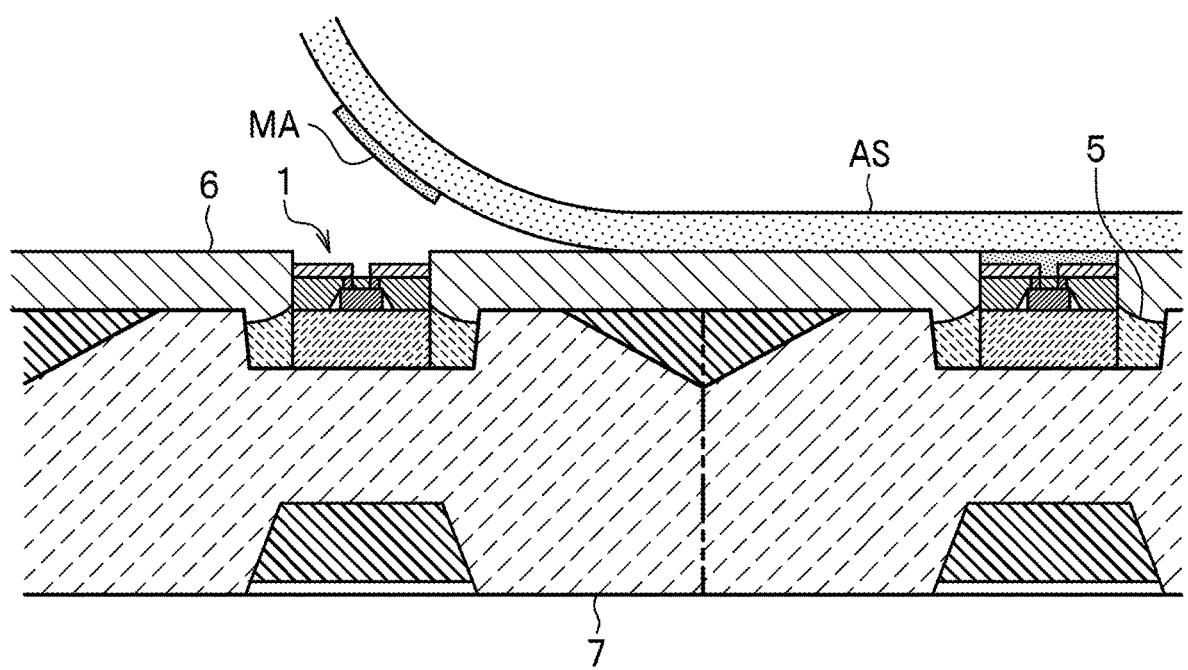
FIG. 6B is a partial cross-sectional view of a mask removal step of the modification of the manufacturing method of the light emitting module according to the embodiment.

The masks covering the upper surfaces of the light emitting devices 1 may be formed before the light emitting device placement step S3. Hereinafter, a manufacturing method of a light emitting module according to a modification of the embodiment is described with reference to FIGS. 6A and 6B. FIG. 6A is a partial cross-sectional view of a mask forming step of the modification of the manufacturing method of the light emitting module according to the embodiment. FIG. 6B is a partial cross-sectional view of a mask removal step of the modification of the manufacturing method of the light emitting module according to the embodiment.

In the modification, the mask forming step is carried out after the metal film forming step S13 (see FIG. 4E) of the provision step S1. Then, as illustrated in FIG. 6A, a mask MA formed of an adhesive film is attached to the entire of the upper surfaces of the light emitting devices 1 arranged in a two-dimensional array in an integrated manner. Preferably, the mask MA has an adhesive force such that the mask MA would not be peeled off from the light emitting devices 1 in the singulation step S14 and the light emitting device placement step S3. In addition, preferably, the mask MA is formed of an adhesive film with good peel-off properties in being peeled off from the metal films 2a, metal films 2c, and first light reflective members 42. The heat resistant temperature of the base material and the adhesive layer (glue) of the mask MA is higher than the curing temperature of the material of the bonding member 5 and the material of the second light reflective member 6. Preferably, the total thickness of the base material and the adhesive layer of the mask MA is in a range from about 40 μm to about 100 μm. Such a mask MA can be, for example, a masking tape whose base material is a polyimide film or the like, which is for use in fabrication of semiconductor elements. Subsequently, in the singulation step S14, the mask MA is cut together with the layer for first light reflective members 42 and the layer for light transmissive members 3 and the like along the cutting lines CL illustrated in FIG. 6A. In this way, singulated light emitting devices 1 are obtained such that a cut piece of the mask MA is attached to the entire upper surface of each light emitting device 1.

After carrying out the light emitting device placement step S3, the light emitting devices 1 are fixed to the light guide plate 7 using the bonding members 5 in the same manner as the above-described embodiment, in a state in which the cut pieces of the mask MA are attached to the light emitting devices 1. The workpiece is now in a state corresponding to the state illustrated in FIG. 5B, which is the state after the mask forming step S4 of the above-described embodiment has been finished. Then, the second light reflective member forming step S5 is carried out in the same manner as the above-described embodiment illustrated in FIGS. 5C and 5D. Subsequently, the mask removal step S6 is carried out. In this modification, the following process is used to remove the mask MA from the light emitting devices 1. As illustrated in FIG. 6B, an adhesive sheet AS is attached to the entire of the upper surface of the workpiece, i.e., the upper surfaces of the second light reflective member 6 and the cut pieces of the mask MA. Preferably, the adhesive sheet AS has an adhesive force stronger than that of the mask MA and has good peel-off properties in being peeled off from the second light reflective member 6. When the adhesive sheet AS is peeled off, the cut pieces of the mask MA adhere to the adhesive sheet AS and are peeled off from the light emitting devices 1. After that, the surfaces of the second light reflective member 6 and the light emitting devices 1 may be cleaned as necessary.

The mask MA may be formed after the singulation step S14. For example, in the singulation step S14, a dicing tape is attached to the lower surfaces of the light emitting devices 1, i.e., to the lower surface of the layer for light transmissive members 3. Then, the layer for light transmissive members 3 and the like are cut so as not to completely cut the dicing tape. After that, before peeling the singulated light emitting devices 1 off the dicing tape, a mask MA having been cut in conformance to the shape of the upper surface of each light emitting device 1 is attached to the upper surface thereof.

The mask M or MA may not necessarily cover the entire of the upper surfaces of the light emitting devices 1 in the mask forming step and may cover at least a part of each of the metal films 2a and metal films 2c. Therefore, for example, in the above-described modification, the mask MA may be attached to the upper surface of the light emitting devices 1 before singulation, and then the areas where the metal film 20 has been partially removed may be irradiated with laser beam to remove the mask MA to expose the layer of first light reflective member 42. Alternatively, in the metal film forming step S13, in a state in which the metal film 20 has been formed on the entire upper surface (see FIG. 4D), the mask MA may be attached to the metal film 20, and after that, the mask MA and the metal film 20 may be processed by laser beam in order. Further, the mask M or MA may be patterned to cover each pair of metal films 2a and 2c with a gap therebetween that is larger than the gap between the pair of metal films 2a and 2c. In this case, the second light reflective member 6 is formed to further cover parts of the metal films 2a and 2c. In this way, the gap between the metal films 2a and 2c exposed from the second light reflective member 6 can be made wider than the gap between the electrodes 12a and 12c of the light emitting element 11. As a result, short-circuiting is not likely to occur even when the pattern of the wiring segments 8 is displaced. In this case, the metal films 2a and 2c are partially covered by the second light reflective member 6 and thus the area connectable to the wiring segments 8 decreases. Therefore, it is preferable that the light emitting device 1 be formed in a large size in a plan view.

Designing the light emitting module 10 includes determining the shapes and positions of the metal films 2a and 2c of each light emitting device 1 in a plan view in conformance with the arrangement of the electrodes 12a and 12c of the light emitting element 11, and determining the pattern of the wiring segments 8. For example, when the electrodes 12a and 12c are arranged side by side in a direction along one side of the light emitting element 11 formed in a square shape in a plan view, the metal films 2a and 2c may each have an oblong rectangular shape which corresponds to one of two halves of a square shape. The wiring segments 8 to be connected with such metal films 2a and 2c of the light emitting device 1 may be patterned to align at the same position in the longitudinal direction of the metal films 2a and 2c.

The light emitting modules according to the present disclosure are usable in various electronic devices provided with a liquid crystal display.

What is claimed is:

1. A method for manufacturing a light emitting module, the method comprising:
    providing light emitting devices each including
        a light emitting element including an upper surface, a lateral surface, and an electrode positioned on the upper surface of the light emitting element and having an upper surface,
        a first light reflective member arranged on the lateral surface of the light emitting element and having an upper surface, and
        a metal film formed on the upper surface of the electrode and the upper surface of the first light reflective member;
    placing the light emitting devices on a light guide plate with gaps between the light emitting devices, with the metal films of the light emitting devices facing upward;
    forming masks respectively covering the metal films;
    forming a second light reflective member in the gaps between the light emitting devices on the light guide plate;
    removing the masks; and
    forming, on the light emitting devices and on the second light reflective member, wiring segments that connect to the metal films.

2. The method of claim 1,
    wherein the step of forming the masks is carried out after the step of providing the light emitting devices and before the step of placing the light emitting devices, and
    wherein the step of forming the masks comprises: arranging the light emitting devices without gaps therebetween, and forming the masks on upper surfaces of the light emitting devices.

3. The method of claim 1,
    wherein the step of providing the light emitting devices comprises: providing a workpiece including the light emitting devices arranged in an integrated manner; and singulating the workpiece into individual pieces respectively constituting the light emitting devices, and
    wherein the step of forming the masks is carried out in the step of providing the light emitting devices and before the step of singulating the workpiece, to form the masks on upper surfaces of the light emitting devices in each of which the metal film has been formed.

4. The method of claim 1,
    wherein the masks are each constituted by a first adhesive sheet, and
    wherein the step of removing the masks comprises removing the masks from the light emitting devices by allowing the masks to adhere to a second adhesive sheet having a stronger adhesive force than the first adhesive sheet.

5. The method of claim 1,
    wherein the step of forming the masks is carried out after the step of placing the light emitting devices and before the step of forming the second light reflective member and comprises forming the masks using a photosensitive film.

6. The method of claim 1,
    wherein the step of forming the second light reflective member comprises:
    supplying a raw material of the second light reflective member before being cured on the light guide plate on which the light emitting devices have been placed, so as to cover the light emitting devices;
    curing the raw material of the second light reflective member, wherein the cured raw material includes portions respectively positioned on the light emitting devices; and
    partially removing the cured raw material to expose the masks.

7. The method of claim 1,
    wherein the step of forming the wiring segments comprises printing conductive paste as the wiring segments.

8. A light emitting module comprising:
    a light guide plate;
    a plurality of light emitting elements disposed on the light guide plate with gaps between the plurality of light emitting elements and each including an upper surface, a lateral surface, an electrode disposed on the upper surface and having an upper surface;
    a first light reflective member disposed on the lateral surface of the light emitting element and having an upper surface;
    a second light reflective member having an upper surface and formed in the gaps between the plurality of light emitting elements such that the upper surfaces of the electrodes of the plurality of light emitting elements are exposed;
    metal films each having an upper surface and formed on the upper surface of the electrode and the upper surface of the first light reflective member of a corresponding one of the plurality of light emitting elements, and each connected to the upper surface of the electrode of the corresponding one of the plurality of light emitting elements; and
    wiring segments respectively formed on the upper surfaces of the metal films and on the upper surface of the second light reflective member such that the wiring segments respectively connect to the metal films at least in part,
    wherein each of the metal films extends from the connected electrode to the upper surface of the first light reflective member of the corresponding one of the plurality of light emitting elements in a plan view.

9. The light emitting module according to claim 8, further comprising
    light guiding members each located between a corresponding one of the plurality of light emitting elements and the first light reflective member of the corresponding one of the plurality of light emitting elements, the light guiding member connected to the lateral surface of the corresponding one of the plurality of light emitting elements.

10. The light emitting module according to claim 8,
wherein the electrode of each of the plurality of light emitting elements comprises a pair of electrodes having a first gap therebetween,
wherein a pair of metal films having a second gap therebetween are connected respectively to the pair of electrodes of the corresponding light emitting element,
wherein each pair of metal films together define a rectangle shape larger than the corresponding light emitting element in the plan view, and
wherein the second gap between each pair of metal films extends in a direction in which the first gap between the pair of electrodes of the corresponding light emitting element extends in the plan view.

11. The light emitting module according to claim 10,
wherein each pair of metal films have a shape similar to a shape of the pair of electrodes of the corresponding light emitting element in the plan view.

12. The light emitting module according to claim 10,
wherein each light emitting element has a rectangular shape in the plan view, and
wherein each pair of metal films are arranged side by side along a diagonal line of the rectangular shape of the corresponding light emitting element in the plan view.

13. The light emitting module according to claim 12,
wherein the wiring segments includes pairs of the wiring segments respectively connected to the pairs of metal films, and
wherein, in the plan view, in a region where each pair of the wiring segments are connected to the corresponding pair of metal films, the pair of wiring segments extend substantially in a first direction, have respective ends which are opposed to each other in the first direction, and are located at positions shifted relative to each other in a second direction perpendicular to the first direction.

14. The light emitting module according to claim 13,
wherein, in the region where each pair of wiring segments are connected to the corresponding pair of metal films, the pair of wiring segments are overlapped when projected onto a line extending in the second direction.

\* \* \* \* \*